United States Patent
Hao et al.

(10) Patent No.: US 11,592,351 B2
(45) Date of Patent: Feb. 28, 2023

(54) URBAN NON-METALLIC PIPELINE LEAKAGE LOCATION METHOD

(71) Applicant: CHANGZHOU UNIVERSITY, Jiangsu (CN)

(72) Inventors: Yongmei Hao, Jiangsu (CN); Juncheng Jiang, Jiangsu (CN); Zhixiang Xing, Jiangsu (CN); Yifei Ma, Jiangsu (CN); Ke Yang, Jiangsu (CN); Lei Ni, Jiangsu (CN); Jie Wu, Jiangsu (CN); Yilong Zhu, Jiangsu (CN)

(73) Assignee: CHANGZHOU UNIVERSITY

( * ) Notice: Subject to any disclaimer, the term of this patent is extended or adjusted under 35 U.S.C. 154(b) by 0 days.

(21) Appl. No.: 17/254,285

(22) PCT Filed: Aug. 11, 2020

(86) PCT No.: PCT/CN2020/108372
§ 371 (c)(1),
(2) Date: Dec. 20, 2020

(87) PCT Pub. No.: WO2021/027803
PCT Pub. Date: Feb. 18, 2021

(65) Prior Publication Data
US 2022/0163421 A1 May 26, 2022

(30) Foreign Application Priority Data
Aug. 13, 2019 (CN) .......................... 201910742549.0

(51) Int. Cl.
*G01M 3/28* (2006.01)
*G06F 17/11* (2006.01)
(Continued)

(52) U.S. Cl.
CPC .......... *G01M 3/2815* (2013.01); *G06F 17/10* (2013.01); *G06F 17/11* (2013.01); *G06F 17/16* (2013.01);
(Continued)

(58) Field of Classification Search
CPC ...... G01M 3/2815; G06F 17/11; G06F 30/20; G06F 30/28; G06Q 50/06
See application file for complete search history.

(56) References Cited

FOREIGN PATENT DOCUMENTS

| CN | 101761780 A | * | 6/2010 |
| CN | 107590336 A | * | 1/2018 |

(Continued)

OTHER PUBLICATIONS

Yang et al., "Research on Leakage Detection and Analysis of Leakage Point in the Gas Pipeline System" Open Journal of Safety Science and Technology, 2011, 1, 94-100 (Year: 2011).*

(Continued)

*Primary Examiner* — John C Kuan

(57) ABSTRACT

Disclosed is an urban non-metallic pipeline leakage location method, the method comprise the following steps: determining whether leakage occurs in a pipeline through numerical simulation law analysis or a Markov chain-based flow analysis method; for a leaking pipeline, establishing an inverse-transient control equation for non-metallic pipeline gas leakage, and obtaining pressure and flow rate data of each measuring point in different periods of time through experiments and substituting the data into the control equation to analyze experimental data; and defining a nonlinear programming problem of an objective function with a least squares criterion, and applying a sequential quadratic programming method to minimize the objective function, so as to determine the size and position of the leakage.

6 Claims, 7 Drawing Sheets

(51) Int. Cl.
  *G06F 30/28*    (2020.01)
  *G06Q 50/06*    (2012.01)
  *G06F 30/20*    (2020.01)
  *G06F 17/10*    (2006.01)
  *G06F 17/16*    (2006.01)

(52) U.S. Cl.
  CPC .............. *G06F 30/20* (2020.01); *G06F 30/28* (2020.01); *G06Q 50/06* (2013.01)

(56) References Cited

FOREIGN PATENT DOCUMENTS

| | | | | |
|---|---|---|---|---|
| CN | 109033591 A | * | 12/2018 | |
| CN | 109210387 A | * | 1/2019 | ............. F17D 5/005 |

OTHER PUBLICATIONS

Ling et al., "A New Method for Leak Detection in Gas Pipelines" 2015 Society of Petroleum Engineers (Year: 2015).*

Soares et al., "Leak detection by inverse transient analysis in an experimental PVC pipe system" Journal of Hydroinformatics, 13.2, 2011 (Year: 2011).*

\* cited by examiner (a) Pipeline pressure distribution during non-leakage at 0.3 MPa (b) Pipeline pressure distribution during leakage at 0.1 MPa (c) Pipeline pressure distribution during leakage at 0.2 MPa (d) Pipeline pressure distribution during leakage at 0.3 MPa (a) Flow velocity vector distribution during non-leakage at 0.3 MPa (b) Flow velocity vector distribution during leakage at 0.1 MPa (c) Pipeline pressure distribution during leakage at 0.2 MPa (d) Pipeline pressure distribution during leakage at 0.3 MPa Pipeline data acquisition during leakage at 0.1 Mpa Pipeline data acquisition during leakage at 0.2 MPa Pipeline data acquisition during leakage at 0.3 MPa

URBAN NON-METALLIC PIPELINE LEAKAGE LOCATION METHOD

FIELD

The present invention relates to urban non-metallic pipeline leakage detection, and in particular, to an urban non-metallic pipeline leakage location method.

BACKGROUND

Because non-metallic pipes have the advantages of high strength, low density, strong corrosiveness, excellent insulating properties, long service life, etc., and thus gradually replace metallic pipes for pipeline transportation of energy sources, raw materials and the like. As the urban buried pipeline network becomes more and more dense, with the increase in the number of these pipelines and the increase in operation time, the hidden dangers or accidents caused by pipeline leakage of non-metallic pipelines due to joint leakage, breakage, or damage by a third party are increasingly. Therefore, effective detection and timely treatment of pipeline faults are particularly important. In recent years, a lot of research work has been done on pipeline leakage detection technologies and leakage location at home and abroad. The research of pipeline leakage detection methods based on an inverse-transient method is developing rapidly.

Inverse-transient analysis (ITA) was originally proposed by Pudar and Liggett abroad in 1992. This method is commonly used in a water distribution network and is a powerful method for friction coefficient leakage detection and calibration in pressurized pipelines. Through this method, the transient flow is started and the pressure is measured somewhere in the system, and leakage parameters are calibrated by reducing the error between the measured pressure and the actual pressure, so as to perform leakage detection and location. For this purpose, the establishment of numerical models and the selection of various optimization technologies have become major challenges for the application of ITA technologies in pipeline leakage detection. Foreign scholars have proposed a hydraulic transient solver for the water distribution network to improve model accuracy and reduce the error, and have adopted lots of algorithms for the optimization solution in ITA. Shuffled complex evolution (SCE) adopted by Vitkovsky in 2001 for the optimization of large hole leakage (the ratio of the leakage hole diameter to the pipeline diameter is greater than 0.1) has good calculation accuracy, but it is not suitable for small hole leakage (the ratio of the leakage hole diameter to the pipeline diameter is equal to or less than 0.1). Particle swarm optimization (PSO) and genetic algorithm (GA) adopted by B. S. Jung in 2010 have strong global search capabilities, but have a large amount of calculation, poor convergence to the objective function, and low friction coefficient calibration capabilities.

SUMMARY

The technical problem to be solved by the present invention is: in order to overcome the shortcomings in the prior art, the present invention provides an urban non-metallic pipeline leakage location method. In the present invention, standards for determining whether leakage occurs in a pipeline are made through numerical simulation of characteristics of pipeline leakage or a Markov method. For a gas pipeline, continuity and motion equations of a gas in the pipeline are adopted to describe the transient flow of the gas in an isothermal pipeline, and a sequence quadratic programing (SQP) method is adopted to solve a nonlinear constraint problem so as to achieve the purpose of minimizing an objective function. The SQP method has good compatibility, rapid convergence, and high calculation efficiency, and can accurately calibrate leakage parameters of small hole leakage, so as to achieve accurate location of gas pipeline leakage.

The technical solutions adopted by the present invention to solve the technical problems thereof are as follows: an urban non-metallic pipeline leakage location method. The method is mainly used for detecting the leakage of complex urban pipelines with bends, numerous valves, meters and pipe branches under large flow pressure. The whole process mainly includes two steps of leakage determination and leakage location, wherein the leakage determination refers to determining pipeline leakage through two methods: software-based numerical simulation law analysis or a Markov method; and the leakage location refers to minimizing the difference between the calculated pressure and the measured pressure of an assumed leakage point through an inverse-transient analysis method to obtain leakage parameters that conform to the actual situation, so as to determine the leakage position. Only by accurately determining which pipeline is leaking can the leakage position be located, and the detection efficiency is improved through double screening.

The method specifically includes the following steps:

S1: determining whether leakage occurs in a pipeline;

when screening and determining a pipeline leakage state, a variety of methods can be used, and the present invention provides two technical solutions.

Technical solution 1: using Fluent software for simulating law analysis to perform leakage determination, specifically including the following steps:

modeling a pipeline by using Ansyslcem, using the Fluent software to simulate pressure and flow rate parameter distributions of the gas in non-metallic pipeline leakage and non-leakage states, and verifying same through experiments to respectively find out the laws of pressure and flow rate parameters of the gas changing with time and space in the non-metallic pipeline leakage and non-leakage states. Standards for determining whether leakage occurs in the pipeline are given.

Step A1: modeling an experimental pipeline, using a structured tetrahedral mesh for region division, and performing proper mesh refinement near a leakage port;

step A2: control equation and algorithm selection:

choosing a standard k–ε double equation model as a numerical model; in the model, using turbulent energy k to reflect the characteristic velocity, using a turbulent energy dissipation rate ε to reflect the characteristic length scale, using Boussinesq hypothesis for simplification to form k equation and ε equation, and combining the two equations together to form a closed equation set to simulate the flow, specifically k equation (1)

$$\frac{\partial(\rho k)}{\partial t} + \frac{\partial(\rho k u_i)}{\partial x_i} = \frac{\partial}{\partial x_j}\left[\left(\mu + \frac{\mu_t}{\sigma_k}\right)\frac{\partial k}{\partial x_j}\right] + G_k + G_b - \rho\varepsilon - Y_M + S_K$$

ε equation $\frac{\partial(\rho\varepsilon)}{\partial t} + \frac{\partial(\rho k u_i)}{\partial x_i} =$ (2)

-continued $$\frac{\partial}{\partial x_i}\left[\left(\mu + \frac{\mu_t}{\sigma_t}\right)\frac{\partial \varepsilon}{\partial x_j}\right] + \frac{C_{1\varepsilon}\varepsilon}{k}(G_k + C_{3\varepsilon}G_b) - C_{2\varepsilon}\rho\frac{\varepsilon^2}{k} + S_\varepsilon$$

where $x_i$, $x_j$, and $x_k$ are coordinate components; $\mu$ is the velocity vector; $\rho$ is the fluid density; $\mu$ is the viscosity coefficient; $\mu_t$ is the turbulent viscosity; $G_k$ and $G_b$ are production terms of velocity gradient and turbulent kinetic energy k caused by buoyancy; constants $C_{1\varepsilon}=1.44$, $C_{2\varepsilon}=1.92$, $C_{3\varepsilon}=0.09$, $\sigma_k=1.0$, and $\sigma_t=1.3$; $S_k$ and $S_\varepsilon$ are user-defined source items; and $Y_M$ is a pulsating expansion term in compressible turbulent flow;

choosing a SIMPLE algorithm as the numerical calculation algorithm of the model; for a given pressure, solving a momentum equation in a discrete form to obtain a velocity field, and then correcting the given pressure and iterating repeatedly until a convergent solution is obtained;

step A3: boundary condition settings, comprising condition settings for an inlet and an outlet, and physical parameter settings for a fluid and a pipe material; and step A4: simulating the changes in internal pressure and flow rate parameters of the pipeline in the pipeline leakage and non-leakage states respectively under given multiple sets of inlet pressures to find out the change laws of pressure and flow rate parameters, so as to give standards for determining whether leakage occurs in the pipeline, and then comparing the actually measured pipeline data with the standards to determine leaking pipelines and non-leaking pipelines; and step A4.1: analyzing the numerically simulated flow fields of internal pressure and flow rate of the pipeline in the leakage and non-leakage states to find out the change laws of the internal pressure and flow rate of the entire pipeline before and after the leakage;

step A4.2: analyzing the flow fields of pressure and flow rate of the experimental pipeline in the leakage and non-leakage states to find out the change laws of the internal pressure and flow rate of the entire pipeline before and after the leakage; and step A4.3: comparatively analyzing the change laws of the internal pressure and flow rate of the pipeline before and after the leakage obtained through the numerical simulation and the pipeline experiments, and summarizing the changes laws to obtain the specific standards for determining the occurrence of leakage of the pipeline.

Technical solution 2: implementing the determination of non-metallic pipeline leakage by using a Markov chain-based method, specifically including the following steps:

step B1: collecting a first set of X flow change rates $q_1$, $q_2$, $q_3$, $q_4$, $q_5$ . . . $q_x$ by using a flow sensor installed on the pipeline, wherein $q_i$ is a flow change rate=$\Delta Q_n/Q_n \times 100\%$; in $q_i$ (i=1, 2, 3, 4, 5 . . . X), i is the order of the X flow change rates collected, $\Delta Q_n$ is the change between the flow rate at the time point $T_n$ and the flow rate at the time point $T_{n-1}$ during data transmission of the sensor, $Q_n$ is the real-time flow rate in the time period T, $T_n$ is the time at which a flow meter collects and transmits flow rate data, and n=1, 2, 3, 4, 5 . . . ; then, setting four change states, which are respectively: a first state: the value of $q_i$ is 0, indicating that the pipe is in a non-leakage state; a second state: the value of $q_i$ is 0-1(%), indicating that the pipe is in a small leakage state; a third state: the value of $q_i$ is 1-3(%), indicating that the pipe is in a leakage expanded state; and a fourth state: the value of $q_i$ is 3-100(%), indicating that the pipe is in a large leakage state.

Setting conditions: the leakage of the pipeline is a sudden change process, the change of the leakage state is a gradual process; the working state of the pipeline may be directly changed from an operation state to a certain degree of leakage in the leakage state due to the influence of various other factors, and the leakage state of the pipeline is irreversible, but the degree of leakage is reversible; according to the above-mentioned conditions, an adjacency matrix A of pipeline leakage is obtained as follows:

$$A = \begin{bmatrix} A_{11} & \cdots & A_{1j} \\ \vdots & \ddots & \vdots \\ A_{i1} & \cdots & A_{ij} \end{bmatrix} = \begin{bmatrix} 1 & 1 & 1 & 1 \\ 0 & 1 & 1 & 1 \\ 0 & 1 & 1 & 1 \\ 0 & 1 & 1 & 1 \end{bmatrix}$$

where $A_{ij}=1$ indicates that there is a transition relationship between the i-th state and the j-th state, and $A_{ij}=0$ indicates that there is no transition relationship between the i-th state and the j-th state, (i=1, 2, 3, 4; j=1, 2, 3, 4).

Step B2: performing state classification on the first set of flow change rates to classify the flow change rates into these four state respectively; in order of time, counting the time interval selected by two adjacent parameters among the X parameters in chronological order; and forming each element in the state transition probability matrix P according to the state transition situation of the flow change rates;

step B2.1: deriving that the number of flow rate changes in the first state is $n_1$ the number of transitions from the first state to the first state is $n_{11}$, the number of transitions from the first state to the second state is $n_{12}$, the number of transitions from the first state to the third state is $n_{13}$, and the number of transitions from the first state to the fourth state is $n_{14}$, and collecting statistics about the state transition situation of these $n_1$ flow change rates at the next moment:

the transition probability from the first state to the first state is $$p_{11} = \frac{n_{11}}{n_1};$$

the transition probability from the first state to the second state is $$p_{12} = \frac{n_{12}}{n_1};$$

the transition probability from the first state to the second state is $$p_{12} = \frac{n_{12}}{n_1};$$

the transition probability from the first state to the fourth state is $$p_{14} = \frac{n_{14}}{n_1};$$

step B2.2: deriving that the number of flow rate changes in the second state is $n_2$, the number of transitions from the second state to the second state is $n_{22}$, the number of transitions from the second state to the third state is $n_{23}$, and the number of transitions from the second state to the fourth state is $n_{24}$, and collecting statistics about the state transition situation of these $n_2$ flow change rates at the next moment:

the transition probability from the second state to the first state is $p_{21}=0$;

the transition probability from the second state to the second state is $$p_{22} = \frac{n_{22}}{n_2};$$

the transition probability from the second state to the third state is $$p_{23} = \frac{n_{23}}{n_2};$$

and the transition probability from the second state to the fourth state is $$p_{24} = \frac{n_{24}}{n_2};$$

step B2.3: deriving that the number of flow rate changes in the third state is $n_3$, the number of transitions from the third state to the second state is $n_{32}$, the number of transitions from the third state to the third state is $n_{33}$, and the number of transitions from the third state to the fourth state is $n_{34}$, and collecting, statistics about the state transition situation of these $n_3$ flow change rates at the next moment:

the transition probability from the third state to the first state is $p_{31}=0$;

the transition probability from the third state to the second state is $$p_{32} = \frac{n_{32}}{n_3};$$

the transition probability from the third state to the third state is $$p_{33} = \frac{n_{33}}{n_3};$$

the transition probability from the third state to the fourth state is $$p_{34} = \frac{n_{34}}{n_3};$$

step B2.4: deriving that the number of flow rate changes in the fourth state is $n_4$, the number of transitions from the fourth state to the second state is $n_{42}$, the number of transitions from the fourth state to the third state is $n_{43}$, and the number of transitions from the fourth state to the fourth state is $n_{44}$, and collecting statistics about the state transition situation of these $n_4$ flow change rates at the next moment:

the transition probability from the fourth state to the first state is $p_{41}=0$;

the transition probability from the fourth state to the second state is $$p_{42} = \frac{n_{42}}{4};$$

the transition probability from the fourth state to the third state is $$p_{43} = \frac{n_{43}}{n_4};$$

and the transition probability from the fourth state to the fourth state is $$p_{44} = \frac{n_{44}}{4};$$

then the state transition probability matrix P in the Markov chain is:

$$P = \begin{bmatrix} p_{11} & p_{12} & p_{13} & p_{14} \\ 0 & p_{22} & p_{23} & p_{24} \\ 0 & p_{32} & p_{33} & p_{34} \\ 0 & p_{42} & p_{43} & p_{44} \end{bmatrix}$$

and it satisfies that: $n_1+n_2+n_3+n_4=X$.

Step B3: collecting a second set of X flow rate changes according to the method of step B1, and counting the number of these X flow change rates in each change state according to the method of step B2; compiling the actual flow change rate at this time in each interval as a first parameter vector and setting it as $\alpha_1=[N_1^{(1)}\ N_2^{(1)}\ N_3^{(1)}\ N_4^{(1)}]$, where $\alpha_1$ represents the first parameter vector, $N_1^{(1)}$ represents the number of flow change rates in the first state among the X flow change rates under the first parameter vector; $N_2^{(1)}$ represents the number of flow change rates in the second state among the X flow change rates under the first parameter vector; $N_3^{(1)}$ represents the number of flow change rates in the third state among the X flow change rates under the first parameter vector; and $N_4^{(1)}$ represents the number of flow change rates in the fourth state among the X flow change rates under the first parameter vector;

obtaining the parameter vector $\beta_1$ of the predicted flow change rate based on the Markov chain in the future time period through calculation by the Markov chain, wherein the formula thereof is:

$$\beta_1=\alpha_1 \times P=[m_1^{(1)} m_2^{(1)} m_3^{(1)} m_4^{(1)}] \quad (3)$$

multiplication by matrix:

$$m_1^{(1)}=N_1^{(1)} \times p_{11} \quad (4)$$

$$m_2^{(1)}=N_1^{(1)} \times p_{12}+N_2^{(1)} \times p_{22}+N_3^{(1)} \times p_{32}+N_4^{(1)} \times p_{42} \quad (5)$$

$$m_3^{(1)}=N_1^{(1)} \times p_{13}+N_2^{(1)} \times p_{23}+N_3^{(1)} \times p_{33}+N_4^{(1)} \times p_{43}$$

$$m_4^{(1)}=N_1^{(1)} \times p_{14}+N_2^{(1)} \times p_{24}+N_3^{(1)} \therefore p_{34}+N_4^{(1)} \therefore p_{44}$$

where $m_1^{(1)}$ represents the predicted number of the flow rate changes in the first state, $m_2^{(1)}$ represents the predicted number of the flow rate changes in the second state, $m_3^{(1)}$ represents the predicted number of the flow rate changes in the third state, and $m_4^{(1)}$ represents the predicted number of the flow rate changes in the fourth state;

Among these X flow rate parameters, S represents the predicted state sequence number, (S=1, 2, 3, 4), a state in which the largest number of traffic parameters are contained is selected, i.e., $N_{S_{max}}$ is selected, and it is considered that the predicted pipeline state at this time is presented as the $(S_{max\_})$-th state.

Step B4: obtaining and collecting the values of a third set of X flow change rates according to the method of step A1, and counting the number of matches in each change state according to the method of step B2 and setting it as $\alpha_2=[N_1^{(2)}\ N_2^{(2)}\ N_3^{(2)}\ N_4^{(2)}]$, wherein among these X flow rate parameters, W represents the actual pipeline state sequence number (W=1, 2, 3, 4), a state in which the largest number of traffic parameters are contained is selected, i.e., $N_{W_{max}}$ is selected, and it is considered that the pipeline is actually in the $(W_{max})$-th state.

Step B5: comparing the values of the state sequence numbers S and W in the predicted state $N_{S_{max}}$ and the actual state $N_{W_{max}}$:

(1) If S=W=1, determining that the pipeline is in a normal operation state;

(2) If S<W, determining that the pipeline is in the early stage of the beginning of leakage, and determining that the pipeline is in the W-th state;

(3) If S>W, determining that the pipeline is in the late stage of the beginning of leakage, and determining that the state thereof is the W-th state; and (4) If S=W≠1, determining that the pipeline is in the stable stage of leakage, and determining that the state thereof is the W-th state.

Step B6: taking the data obtained in step B3 as the first set of data and the data obtained in step B4 as the second set of data, continuing to predict and determine the real-time state or leakage situation of the pipeline, and starting to iterate the data again. The leakage detection method of step B1 to step B6 can be used as an auxiliary means for locating leakage by using infrasonic waves at the time when the leakage state is detected by using this method.

After screening out the leaking pipeline, a step of locating the leakage position is performed to determine the specific leakage position, thereby facilitating maintenance and repair. The location of the leakage position specifically includes the following steps:

S2: pipeline leakage experiment: obtaining pipeline pressure and flow rate data.

The specific approach is: producing transient pipe flow by gradually closing a valve, maintaining the valve closing time long enough to minimize the influence of instability and the uncertainty of a friction coefficient, setting multiple monitoring points evenly distributed on the pipeline, wherein the distance between two adjacent monitoring points is $\Delta x$, so as to obtain pressure and flow rate data of each measuring point in different periods of time.

S3: establishing a pipeline leakage control equation to determine the leakage position:

establishing a control equation of anon-metallic pipeline gas leakage state by using a nonlinear equation solved based on continuity an d motion equations of a gas and a leakage amount equation of a leakage hole, substituting pressures $P_A$ and $P_B$ and flow rates $M_A$ and $M_B$ at both ends $\Delta x$ of a certain monitoring point measured in step 2 into the control equation to obtain equations for calculating pressure $P_L$ and flow rates $M_1$ and $M_2$ of the monitoring point, $M_1$ is the flow rate when flowing into the monitoring point, and $M_2$ is the flow rate when flowing out of the monitoring point; on this basis, comparing the calculated pressure $P_L$ of the monitoring point at a certain time point with real data of test according to the principle of inverse-transient calculation, and converging the difference between the two to a minimum value by using an SQP algorithm so as to obtain leakage parameters that conform to the actual situation;

the continuity and motion equations of the gas are:

$$\frac{\partial M}{\partial t}+\frac{1}{A}\frac{\partial}{\partial x}\left(\frac{M^2}{\rho}\right)+A\frac{\partial p}{\partial x}+\frac{\lambda}{2DA\rho}M|M|=0 \tag{8}$$

$$A\frac{\partial \rho}{\partial t}+\frac{\partial M}{\partial x}=0 \tag{9}$$

Where M is the flow velocity of the gas (whose dimensional unit is $kg \cdot S^{-1}$); A is the cross sectional area of the pipeline (whose dimensional unit is $m^2$); P is the pressure (whose dimensional unit is Pa); $\rho$ is the gas density (whose dimensional unit is $kg \cdot m^{-3}$); D is the inner diameter of the pipeline (whose dimensional unit is m); and $\lambda$ is the friction resistance coefficient.

equations (1) and (2) are solved by using a characteristic line method to obtain two sets of characteristic line equations, which are expressed by C+ and C−, specifically as follows:

$$C+:\frac{1}{a}\frac{dp}{dt}+\frac{1}{A}\frac{dM}{dt}+\frac{\lambda a^2 M|M|}{2DA^2 P}=0 \tag{10}$$

$$\frac{dx}{dt}=a \tag{11}$$

$$C-:-\frac{1}{a}\frac{dp}{dt}+\frac{1}{A}\frac{dM}{dt}+\frac{\lambda a^2 M|M|}{2DA^2 P}=0 \tag{12}$$

$$\frac{dx}{dt}=-a \tag{13}$$

where $\alpha$ is the velocity of pressure wave (m/s); and when the gas pipeline is flowing isothermally, $\alpha$ is a constant value.

Formulas (11) and (13) are C+ and C− characteristic lines AP and BP, respectively; and formulas (10) and (12) are compatibility equations satisfying the respective characteristic lines. The pipeline is equally divided into N equal parts, with the step length being $\Delta x$ and the time step length being $\Delta t=\alpha\Delta x$; formulas (10) and (12) are integrated along the C+ characteristic line AP and the C− characteristic line BP, respectively; second-order approximation is used for the third term of the compatibility equation, namely the friction term, to obtain two nonlinear equations on the C+ characteristic line and the C− characteristic line, specifically as follows:

$$P_P-P_A+\frac{a}{A}(M_P-M_A)+\frac{\lambda a^2 \Delta x}{4DA^2}\left(\frac{M_A|M_A|}{P_A}+\frac{M_P|M_P|}{P_P}\right)=0 \tag{14}$$

$$P_B-P_P+\frac{a}{A}(M_P-M_B)+\frac{\lambda a^2 \Delta x}{4DA^2}\left(\frac{M_B|M_B|}{P_B}+\frac{M_P|M_P|}{P_P}\right)=0 \tag{15}$$

Where $M_P$ is the flow rate at the monitoring point requiring the calculation of the leakage parameters ($kg \cdot S^{-1}$); and $P_P$ is the pressure at the monitoring point requiring the calculation of the leakage parameters (Pa).

If the pipeline leakage is regarded as small hole leakage, the gas leakage formula depends on the flow velocity of the gas at the leakage port, and the flow velocity of the gas at the leakage port is generally subsonic, specifically as follows.

$$M_L = A_e P_d \sqrt{\frac{k}{RT}\left(\frac{2}{k+1}\right)^{\frac{k+1}{k-1}}} \quad (16)$$

where $M_L$ is the leakage flow rate of the leakage hole (kg·s$^{-1}$); $A_e = CA_0$ is the effective leakage area (m$^2$); C is the orifice coefficient, which is related to the shape of the leakage hole; $A_0$ is the area of the leakage hole (m$^2$); $P_d$ is the initial pressure of the pipeline (Pa); k is the adiabatic coefficient of the gas (dimensionless); R is the gas constant (J·kg$^{-1}$·K$^{-1}$); and T is the temperature of the gas (K).

It is assumed that the monitoring node is a leakage point, a leakage control equation is established to analyze the pressure and flow rate data of the monitoring node; taking the leakage hole as the boundary, the flow characteristics within a distance $\Delta x$ before flowing into the leakage hole satisfy formula (14), and the flow characteristics within the distance $\Delta x$ after flowing out of the leakage hole satisfy formula (15). It is supposed that the subscript of the fluid parameter before flowing through the leakage hole is 1, and the subscript of the fluid parameter after flowing through the leakage hole is 2. Then the established leakage control equation is specifically as follows:

$$P_1 - P_A + \frac{a}{A}(M_1 - M_A) + \frac{\lambda a^2 \Delta x}{4DA^2}\left(\frac{M_A|M_A|}{P_A} + \frac{M_1|M_1|}{P_1}\right) = 0 \quad (17)$$

$$P_B - P_2 + \frac{a}{A}(M_2 - M_B) + \frac{\lambda a^2 \Delta x}{4DA^2}\left(\frac{M_B|M_B|}{P_B} + \frac{M_2|M_2|}{P_2}\right) = 0 \quad (18)$$

$$M_L = A_e P_d \sqrt{\frac{k}{RT}\left(\frac{2}{k+1}\right)^{\frac{k+1}{k-1}}} \quad (19)$$

$$M_1 - M_2 = M_L \quad (20)$$

$$P_1 = P_2 = P_L \quad (21)$$

where $P_1$ and $M_1$ are the fluid pressure (Pa) and flow rate (kg·s$^{-1}$), at a distance before flowing into the leakage point; $P_2$ and $M_2$ are the fluid pressure (Pa) and flow rate (kg·s$^{-1}$), at a distance after flowing out of the leakage point; and $P_L$ is the pressure at the leakage point (Pa).

S4: defining an objective function:

performing inverse problem analysis on the determined leakage parameters by taking the minimum value of the difference between the calculated value and the measured value of the pressure at the monitoring point as a control target and taking the control equation and boundary conditions as limiting conditions, to define an objective function with a least squares objective criterion, wherein the pressures $P_A$ and $P_B$ and flow rates $M_A$ and $M_B$ of measuring points A and B at the both ends $\Delta x$ of the monitoring point a at a certain time point are given by the experiment, the calculated pressures $P_1$ and $P_2$ ($P_1 = P_2 = P_L$) and flow rates $M_1$ and $M_2$ at the both ends of the monitoring point are unknown after a unit time step $\Delta t$, and based on the difference in flow rate, whether leakage occurs in the monitoring point a is determined; substituting the known data according to the leakage control equation in S3 and expressing an equation of the flow rates $M_1$ and $M_2$ on the pressure $P_L$ at the both ends of the monitoring point, and determining the constraint range of the effective leakage area of a decision variable; obtaining flow rate data of the monitoring point conforming to the real situation by converging the difference between the calculated pressure $P_L$ and the real pressure to the minimum, and substituting the flow rate data into a gas leakage amount equation to obtain an effective leakage area, so as to determine the leakage situation of the monitoring point;

S4.1: defining an objective function with a least squares criterion:

$$E = \min \sqrt{\sum_{i=1}^{M}(P_i - P'_i)^2} \quad (22)$$

Where E is the objective function; M is the number of time steps; $P_i$ is the calculated pressure (Pa); and $P'_i$ is the measured pressure (Pa). The effective leakage area that best conforms to the actual situation is generated by minimizing the objective function E to zero, and whether the node is leaking is determined according to the value of the effective area;

S4.2: determining the limit range of the effective leakage area:

$$0 \leq A_{ei} \leq A_{emax} \quad (23)$$

where $A_{ei}$ is the effective leakage area at node i; and $A_{emax}$ is the maximum limit of the leakage area, which is determined as a reasonable proportion of the cross sectional area of the pipeline.

S4.3: calculating the friction resistance coefficient by a friction resistance calculation formula according to the experimental data, wherein the flow of the gas pipeline is generally in a turbulent region, specifically:

Blasius formula:

$$\lambda = \frac{0.3164}{Re^{0.25}} \quad (24)$$

wherein the Reynolds coefficient calculation formula adopts an empirical formula:

$$Re = 0.354 \times \frac{Q_v}{D\upsilon} \quad (25)$$

$$\upsilon = \frac{\mu}{\rho} \quad (26)$$

Where $\lambda$ is the friction resistance coefficient; Re is the Reynolds coefficient; $Q_v$ is the volume flow rate (m$^3$·s$^{-1}$); D is the inner diameter of the pipeline (m); $\upsilon$ is the kinematic viscosity (m$^2$·s$^{-1}$); $\mu$ is the dynamic viscosity (Pa·s); and $\rho$ is the gas density (kg·m$^{-3}$).

S5: algorithm optimization:

Shuffled complex evolution (SCE) has good calculation accuracy for large hole leakage, but is not suitable for small hole leakage. Particle swarm optimization (PSO) and genetic algorithm (GA) have strong global search capabilities, but have a large amount of calculation, poor convergence to the objective function, and low friction coefficient calibration capabilities. The SQP algorithm has the advantages of good convergence, high calculation efficiency, and strong boundary search capability, etc. for solving nonlinear optimization problems, and can solve the problem of accurate calibration of leakage parameters of small hole leakage.

In order to solve the non-linear programming problem of the objective function, the present patent adopts the SQP method to determine the effective leakage area by minimizing the objective function according to the pressure and flow rate data obtained in S3 within the flow rate limit ranges at the both ends of the monitoring point set based on the constraint range of the effective leakage area of the decision variable determined in S4.

S5.1: establishing an M file, substituting the experimental data into the objective function formula established in S4, and defining an objective function E(x) according to specific experimental data;

S5.2: establishing an M file and defining the nonlinear constraint $Ax \leq b$ or $Aeq \cdot X = Beq$ in the constraint condition;

S5.3: determining the initial value $X_0$ of iteration;

S5.4: determining the upper and lower limits VLB and VUB of the variable; and

S5.5: establishing a main program, wherein the function of a nonlinear programming solution is fmincon, and running the solution.

S6: leakage location:

S6.1: if the leakage area of a node is found to be non-zero at the end of the minimization in S5, regarding the node as a leaking node; and S6.2: because the location method based on an inverse-transient method is mainly to determine whether the monitoring point is leaking, the location accuracy is closely related to the set number of monitoring points, but this method fails to give a location formula of a conventional method, thus if the leakage point is not at the monitoring point i.e., neither of the leakage areas of two adjacent monitoring points is zero, then considering that the leakage point is between two adjacent monitoring points of which neither of the leakage areas is zero, and equidistantly arranging a plurality of measuring nodes between the two monitoring points; substituting the measured data and calculated data into the objective function, repeating S5 until the distance between the nodes is less than 4% of a pipeline detection length.

The present invention has the following beneficial effects: the present invention provides an urban non-metallic pipeline leakage location method; compared with the prior art, the method can determine the effective leakage area while locating non-metallic pipes, apply the inverse problem to leakage detection by defining an objective function with a least squares criterion, and determine leakage parameters by using a sequential quadratic programming (SQP) method, thereby ensuring the convergence speed and calculation accuracy of the objective function, so that the detection of the effective leakage area of each node is more accurate and faster.

BRIEF DESCRIPTION OF THE DRAWINGS

The present invention is further descried blow in conjunction with the accompanying drawings and embodiments.

Figure 1:
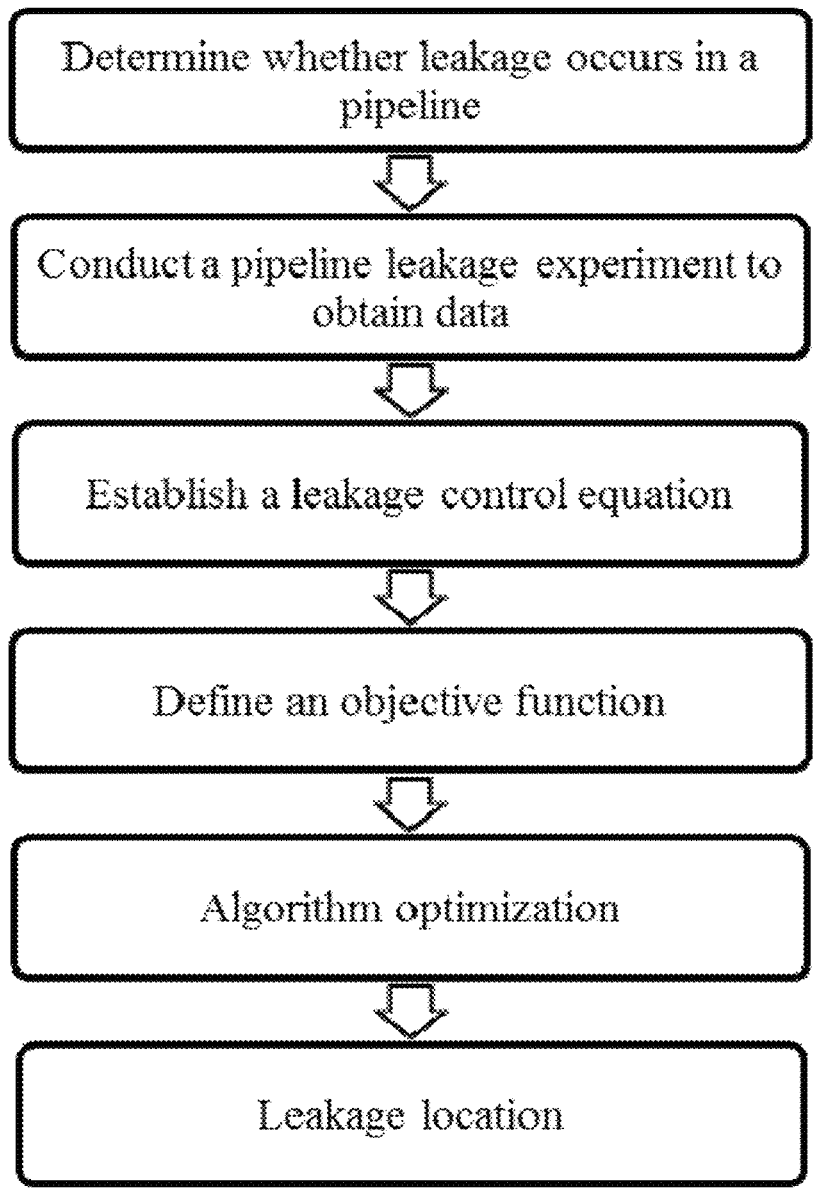
FIG. 1 is a schematic flowchart according to the present invention.

In the drawings: 1—upstream flow sensor, 2—upstream pressure sensor, 3—upstream infrasonic sensor, 4—leakage valve, 5—downstream infrasonic sensor, 6—downstream pressure sensor, 7—downstream flow sensor.

DETAILED DESCRIPTION

The present invention is now descried in detail in conjunction with the accompanying drawings. The drawings are simplified schematic diagrams, which only illustrate the basic structure of the present invention in a schematic way, so the drawings only show the structures related to the present invention.

Figure 2:
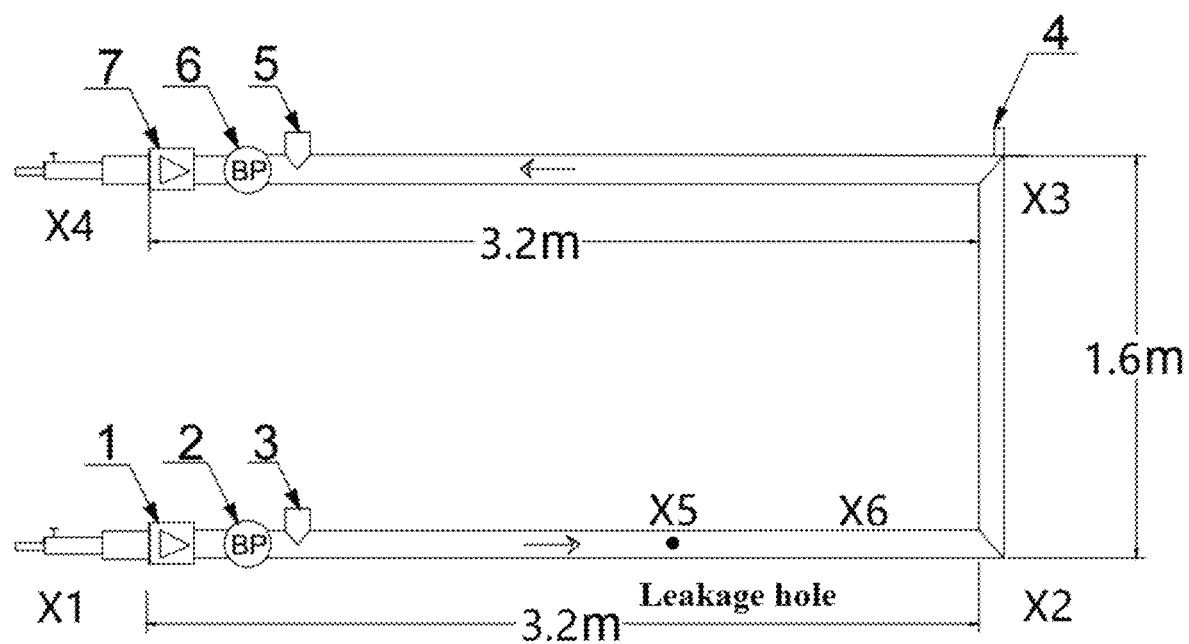
FIG. 2 is a schematic structural diagram of a pipeline system according to the present invention.
Figure 3:
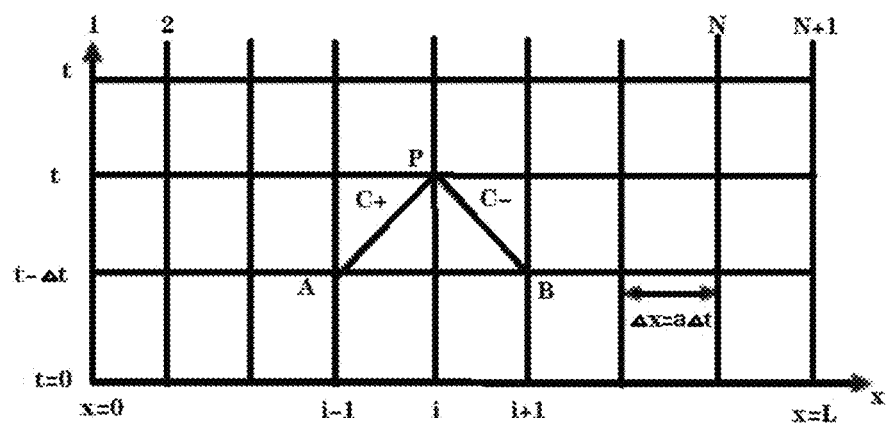
FIG. 3 is a schematic diagram of a characteristic mesh with a specific time interval.

As shown in FIG. 2, the experimental pipe section of the present invention adopts three straight pipe sections connected in sequence to form a U-shaped structure, wherein $X_1$-$X_2$ pipe section is 3.2 m long, $X_2$-$X_3$ pipe section is 1.6 m long, and $X_3$-$X_4$ pipe section is 3.2 m long. The leakage hole is at $X_5$. At 2 m from the pipe inlet, the diameter of the leakage hole is 1 mm. $X_1$ is positioned at the inlet of the pipeline, $X_4$ is positioned at the outlet of the pipeline, and $X_6$ is 2.8 m away from the inlet. Moreover, an upstream flow sensor 1, an upstream pressure sensor 2 and an upstream infrasonic sensor 3 are arranged at the inlet end of the pipeline. A downstream flow sensor 7, a downstream pressure sensor 6 and a downstream infrasonic sensor 5 are sequentially arranged at the outlet end of the pipeline. The leakage valve 4 is provided at $X_3$.

Embodiment 1 in this embodiment, Fluent software is used for simulating law analysis to perform leakage determination.

As shown in FIG. 1, the urban non-metallic pipeline leakage location method according to the present invention includes: using Fluent software to simulate pressure and flow rate parameter distributions of a gas in non-metallic pipeline leakage and non-leakage states, studying the characteristics of gas leakage in a non-metallic pipeline to give standards for determining whether leakage occurs in the pipeline, and comparing the experimental data with the standards to determine leaking pipeline and non-leaking pipelines, then locating leaking points of the leaking pipelines in combination with an inverse-transient method.

S1: Determine whether leakage occurs in a pipeline.

Figure 4:
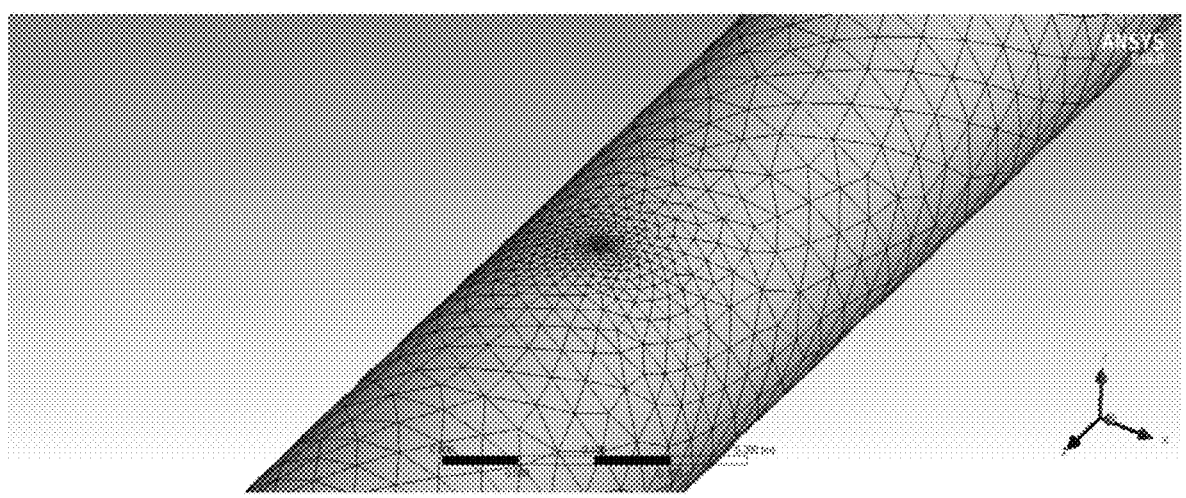
FIG. 4 is a schematic diagram of leakage mesh division.

Step A1: model an experimental U-shaped pipeline. The size settings are the same as those of the experimental device. Two end pipe sections are 3.2 m long, the middle pipe section is 1.6 m long, and the pipe diameter is 0.0456 m. The leakage hole is positioned 2 m distant from the head end of the pipeline, and the diameter of the leakage hole is 1 mm. A structured tetrahedral mesh is used for mesh division to obtain divided regions, and proper mesh refinement is performed near a leakage port. See FIG. 4 for the mesh refinement at the leakage port.

Step A2: control equation and algorithm selection:

choosing a standard k–ε double equation model as a numerical model; in the model, using turbulent energy k to reflect the characteristic velocity, using a turbulent energy dissipation rate ε to reflect the characteristic length scale, using Boussinesq hypothesis for simplification to form k equation and ε equation, and combining the two equations together to form a closed equation set to simulate the flow, specifically:

k equation (1)

$$\frac{\partial(\rho k)}{\partial t} + \frac{\partial(\rho k u_i)}{\partial x_i} = \frac{\partial}{\partial x_j}\left[\left(\mu + \frac{\mu_t}{\sigma_k}\right)\frac{\partial k}{\partial x_j}\right] + G_k + G_b - \rho\varepsilon - Y_M + S_K$$

ε equation $\frac{\partial(\rho\varepsilon)}{\partial t} + \frac{\partial(\rho k u_i)}{\partial x_i} =$ (2)

$$\frac{\partial}{\partial x_i}\left[\left(\mu + \frac{\mu_t}{\sigma_t}\right)\frac{\partial \varepsilon}{\partial x_j}\right] + \frac{C_{1\varepsilon}\varepsilon}{k}(G_k + C_{3\varepsilon}G_b) - C_{2\varepsilon}\rho\frac{\varepsilon^2}{k} + S_\varepsilon$$

where $x_i$, $x_j$, and $x_k$ are coordinate components; u is the velocity vector; ρ is the fluid density; μ is the viscosity coefficient; $\mu_t$ is the turbulent viscosity; $G_k$ and $G_b$ are production terms of velocity gradient and turbulent kinetic energy k caused by buoyancy; constants $C_{1\varepsilon}$=1.44, $C_{2\varepsilon}$=1.92, $C_{3\varepsilon}$=0.09, $\sigma_k$=1.0, and $\sigma_t$=1.3; $S_k$ and $S_\varepsilon$ are user-defined source items; and $Y_M$ is a pulsating expansion term in compressible turbulent flow;

choosing a SIMPLE algorithm as the numerical calculation algorithm of the model; for a given pressure, solving a momentum equation in a discrete form to obtain a velocity field, and then correcting the given pressure and iterating repeatedly until a convergent solution is obtained.

Step A3: boundary condition settings:

Inlet boundary condition settings: the inlet boundary condition for a compressible fluid should be set as pressure inlet; in this experiment, numerical simulations are performed under three inlet pressures, which are set to 0.3 MPa, 0.2 MPa and 0.1 MPa, respectively.

outlet boundary condition settings: the outlet boundary condition is set as a pressure outlet, and both the end outlet of the pipeline and the end outlet of the leakage hole are set to the external environmental pressure;

fluid medium settings: the medium in the air is air, and the physical properties of the air are shown in Table a;

pipeline material settings: the material of the pipeline is PE, the specific heat capacity is 0.45 cal/g° C., the density is 0.956 g/cm³, and the thermal conductivity is 0.5 W/m·K.

TABLE a

Table of physical properties of air at room temperature

| density kg/m³ | viscosity 10⁻⁵ Pa · s | specific heat capacity kJ/(kg · K) | Prandtl number Pr |
|---|---|---|---|
| 1.225 | 1.81 | 1.005 | 0.703 | step A4: simulate the changes in internal pressure and flow rate parameters of the pipeline in the pipeline leakage and non-leakage states respectively under given multiple sets of inlet pressures to find out the change laws of pressure and flow rate parameters, so as to give standards for determining whether leakage occurs in the pipeline, and then compare the actually measured pipeline data with the standards to determine leaking pipelines and non-leaking pipelines.

step A4.1: numerical simulation of flow field distribution of pipeline pressure and flow velocity.

Figure 5:
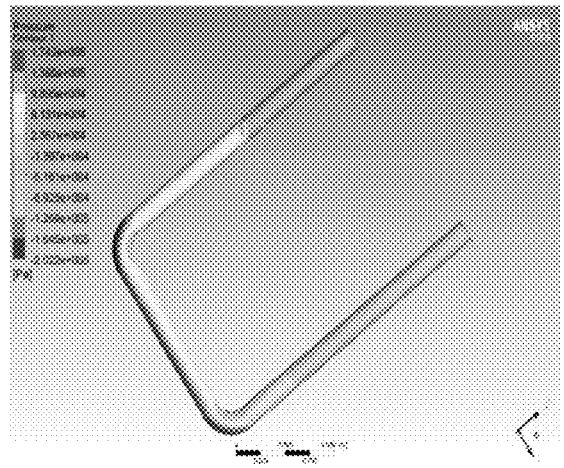
FIG. 5 is a simulated pipeline pressure profile in two states.
Figure 5:
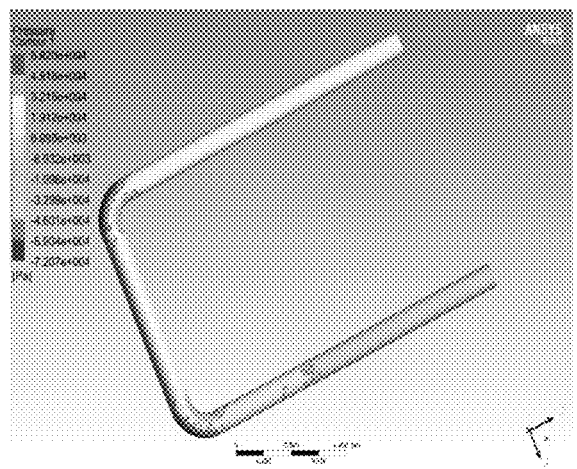
Figure 5:
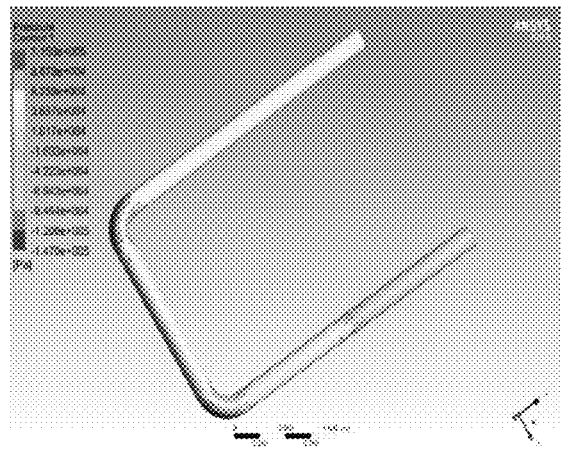
Figure 5:
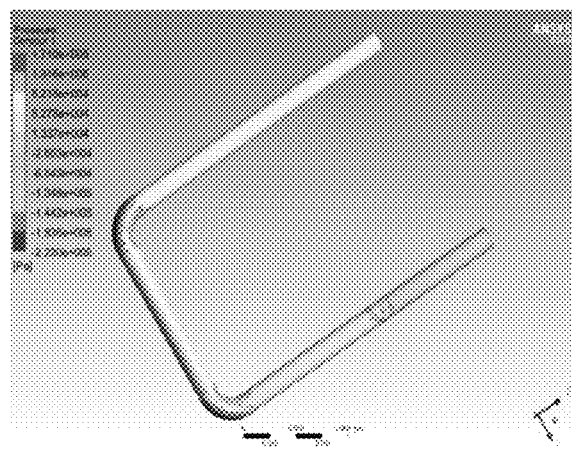

Referring to figure a in FIG. 5, when there is no leakage under the inlet pressure of 0.3 MPa, the pressure values in the pipeline is generally linearly distributed from upstream to downstream, and the pressure gradient within a certain range is maintained to decrease with the increase of pipeline length. Referring to figure b in FIG. 5, under the same inlet pressure, when leakage occurs in the pipeline, the overall pressure in the pipeline decreases significantly, the most obvious is that the pressure in the vicinity of the leakage hole increases about 4.5×10⁴ Pa as compared with that under non-leakage, and the pressure gradients in front of and behind the leakage hole decrease significantly. Referring to figures b, c, and d in FIG. 5, by comparing the pressure profiles of the pipeline leakage state under different inlet pressures, the greater the pipeline inlet pressure is, the greater the pressure gradient in the pipeline is, and the pressure in the vicinity of the leakage hole generally decreases and the pressure change range of the pipe sections in front of and behind the leakage hole decreases.

Figure 6:
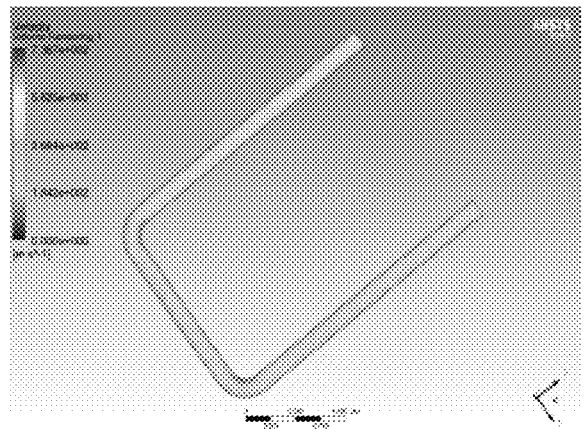
FIG. 6 is a simulated pipeline velocity vector profile in two states.
Figure 6:
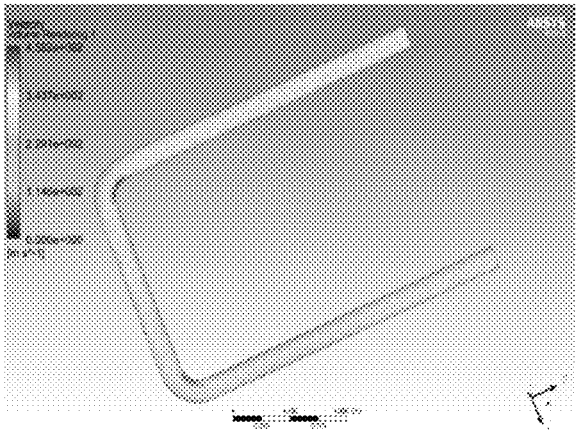
Figure 6:
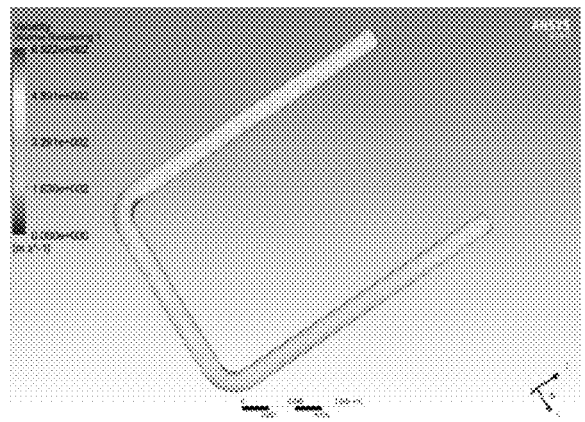
Figure 6:
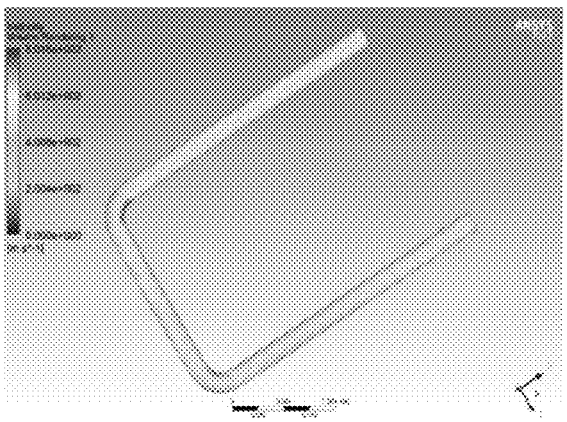

Referring to figure a in FIG. 6, when there is no leakage at 0.3 MPa, the flow velocity in the pipeline tends to be stable, and the overall change range is very small. Referring to figure b in FIG. 6, when there is leakage at 0.3 MPa, the flow velocity on the outer wall of the pipeline increases significantly, because when the pipeline is leaking, the pressure difference between the inside and outside of the pipeline accelerates the flow of the gas in the pipeline, resulting in a larger difference between the flow velocity outside the pipeline and the flow velocity inside. Referring to figures b, c, and d in FIG. 6, by comparing the velocity vector profiles of the pipeline leakage state under different inlet pressures, it can be known that in the leakage state, the greater the inlet pressure of the pipeline is, the greater the overall flow velocity in the pipeline is, and the greater the difference between flow velocities on the inner and outer walls are.

Figure 7:
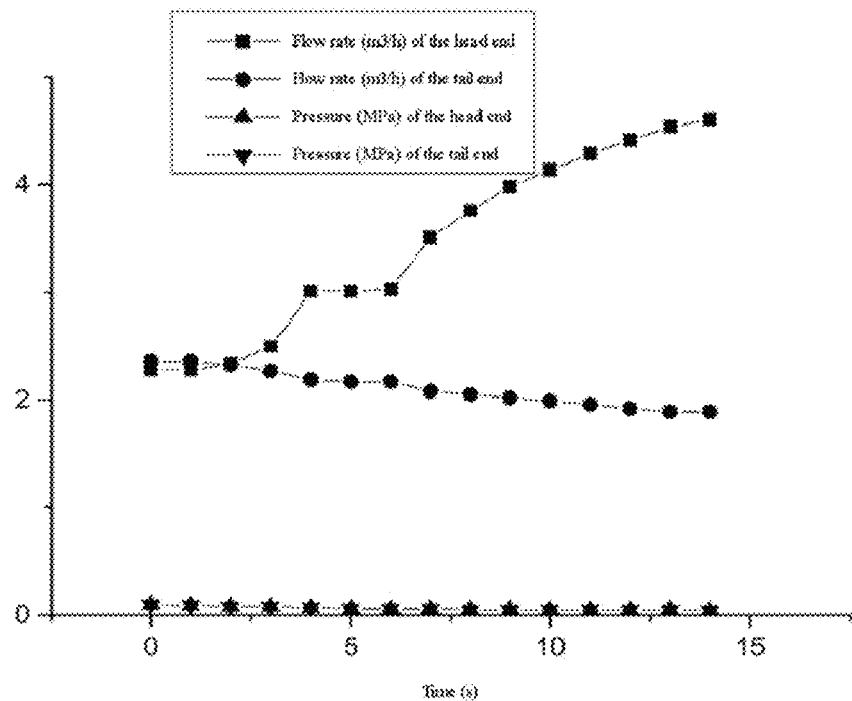
FIG. 7 is a diagram of pipeline experiment data collection.
Figure 7:
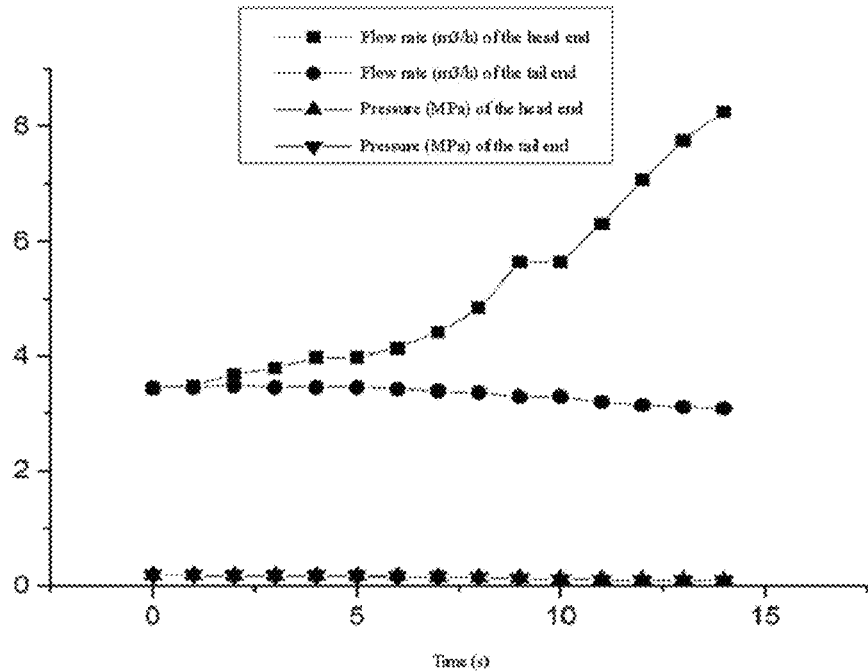
Figure 7:
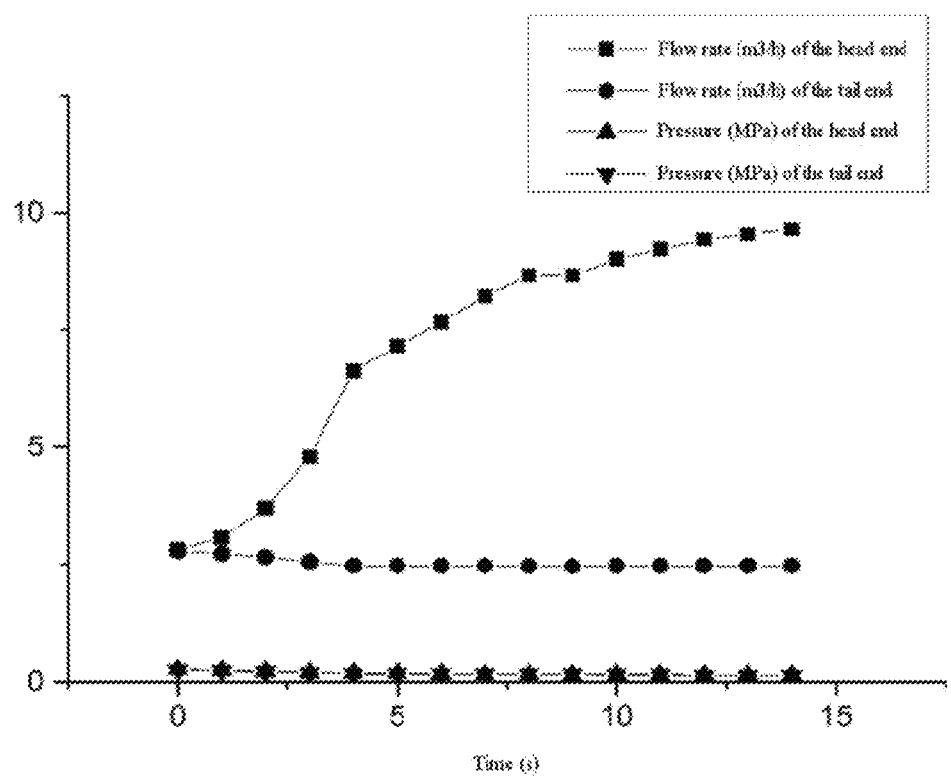

Step A4.2: flow field distribution of pressure and flow velocity of an experimental pipeline:

Referring to FIG. 7, the broken line based on square mark indicates the upstream flow rate, and the broken line based on circular mark is the downstream flow rate, the broken line based on regular angular mark is the upstream pressure, and the broken line based on inverted triangular mark is the downstream pressure. As shown in figures a, b, and c in FIG. 7, when leakage occurs, the flow rate at the front end of the leakage hole greatly increases, and the flow rate at the rear end of the leakage hole slightly decreases. After a period of time, the flow rate in the front section of the leakage hole decreases, and the flow rates at both ends of the leakage hole remain unchanged. The greater the inlet pressure is, the greater the difference in flow rate is. When leakage occurs, the pressure of the entire pipeline decreases, and the difference between upstream and downstream pressures is not obvious.

Step A4.3: comparative analysis of numerical simulation and experimental results In the experiment, through simulation and experimental comparison on pipeline state changes before and after leakage due to holes with difference diameters of a simulated urban fuel pipeline, substantially similar conclusions can be obtained, but there are also different results. Similar conclusions: when leakage occurs, the overall pressure in the pipeline decreases, the pressure gradient decreases, and the gas flow rate in the pipeline becomes faster. Different conclusions: in the experiment, the flow velocity in the front pipe section of the leakage hole is accelerated, and the flow velocity in the back pipe section is slightly reduced, and in the simulation, the flow velocities on the inner and outer walls of the entire pipeline are quite different, but the flow velocities in front of and behind the leakage hole are not changed significantly. Through comprehensive numerical simulation and experimental analysis, and in combination with related articles, two standards for parameter changes during the occurrence of leakage in the pipeline are obtained: (1) when leakage occurs, the overall pressure in the pipeline decreases, the pressure gradient decreases, and the gas flow rate in the pipeline becomes faster; (2) the flow velocity in the front section of the leakage hole increases, the flow velocity in the back section decreases slightly, and the flow rate differences in front of and behind the leakage hole gradually increase in a short time and then remain unchanged.

S2: pipeline leakage experiment: obtaining pipeline pressure and flow rate data.

Transient pipe flow is produced by gradually closing a valve, the valve closing time lasts long enough to minimize the influence of instability and the uncertainty of a friction coefficient, so as to obtain pressure and flow rate data of measuring points X1, X2, X3, and X4 in different periods of time, and pressure and flow rate data at $\Delta x$, i.e., 1.6 m, from both ends of the measuring points, see Tables 1 and 2.

TABLE 1

Flow rate data of each node under leakage at 0.3 Mpa

| Sequence number | X1 flow rate/ m3/h | X2 flow rate/ m3/h | X3 flow rate/ m3/h | X4 flow rate/ m3/h |
|---|---|---|---|---|
| 1 | 2.82 | 2.79 | 2.79 | 2.79 |
| 2 | 3.07 | 2.74 | 2.74 | 2.73 |
| 3 | 3.7 | 2.67 | 2.67 | 2.66 |
| 4 | 4.79 | 2.58 | 2.58 | 2.56 |
| 5 | 6.62 | 2.49 | 2.49 | 2.48 |
| 6 | 7.16 | 2.49 | 2.49 | 2.48 |
| 7 | 7.66 | 2.49 | 2.49 | 2.48 |
| 8 | 8.22 | 2.49 | 2.48 | 2.48 |
| 9 | 8.66 | 2.47 | 2.47 | 2.47 |
| 10 | 8.66 | 2.46 | 2.46 | 2.46 |
| 11 | 9.01 | 2.49 | 2.49 | 2.48 |
| 12 | 9.22 | 2.49 | 2.49 | 2.48 |
| 13 | 9.42 | 2.49 | 2.49 | 2.48 |
| 14 | 9.54 | 2.49 | 2.49 | 2.48 |
| 15 | 9.64 | 2.49 | 2.49 | 2.48 |

TABLE 2

Pressure data of each node under leakage at 0.3 Mpa

| Sequence number | X1 pressure/MPa | X2 pressure/MPa | X3 pressure/MPa | X4 pressure/MPa |
|---|---|---|---|---|
| 1 | 0.26 | 0.26 | 0.26 | 0.25 |
| 2 | 0.24 | 0.24 | 0.24 | 0.23 |
| 3 | 0.22 | 0.22 | 0.22 | 0.21 |
| 4 | 0.2 | 0.2 | 0.2 | 0.19 |
| 5 | 0.19 | 0.19 | 0.19 | 0.17 |
| 6 | 0.18 | 0.18 | 0.18 | 0.17 |
| 7 | 0.17 | 0.17 | 0.17 | 0.16 |
| 8 | 0.16 | 0.16 | 0.16 | 0.16 |
| 9 | 0.16 | 0.16 | 0.16 | 0.15 |
| 10 | 0.15 | 0.15 | 0.15 | 0.15 |
| 11 | 0.15 | 0.15 | 0.15 | 0.14 |
| 12 | 0.15 | 0.15 | 0.15 | 0.14 |
| 13 | 0.14 | 0.14 | 0.14 | 0.13 |
| 14 | 0.14 | 0.14 | 0.14 | 0.13 |
| 15 | 0.14 | 0.14 | 0.14 | 0.13 |

S3: Establish a pipeline leakage control equation.

Assuming that the node is a leakage point, a control equation of a non-metallic pipeline gas leakage state is established by using a nonlinear equation solved based on continuity and motion equations of a gas and a leakage amount equation of a leakage hole, for example:

$$P_1 - P_A + \frac{a}{A}(M_1 - M_A) + \frac{\lambda a^2 \Delta x}{4DA^2}\left(\frac{M_A|M_A|}{P_A} + \frac{M_1|M_1|}{P_1}\right) = 0 \quad (17)$$

$$P_B - P_2 + \frac{a}{A}(M_2 - M_B) + \frac{\lambda a^2 \Delta x}{4DA^2}\left(\frac{M_B|M_B|}{P_B} + \frac{M_2|M_2|}{P_2}\right) = 0 \quad (18)$$

$$M_L = A_e P_d \sqrt{\frac{k}{RT}\left(\frac{2}{k+1}\right)^{\frac{k+1}{k-1}}} \quad (19)$$

$$M_1 - M_2 = M_L \quad (20)$$

$$P_1 = P_2 = P_L \quad (21)$$

where $P_A$ and $M_A$ are the fluid pressure (Pa) and flow rate (kg·s$^{-1}$), at $\Delta x$ in front of the node; $P_B$ and $M_B$ are the fluid pressure (Pa) and flow rate (kg·s$^{-1}$), at $\Delta x$ behind the node; and $P_L$ is the pressure at the leakage point (PaA); $P_1$ and $M_1$ are the fluid pressure (Pa) and flow rate (kg·s$^{-1}$) , at a distance before flowing into the leakage point; $P_2$ and $M_2$ are the fluid pressure (Pa) and flow rate (kg·s$^{-1}$), at a distance after flowing out of the leakage point; $P_L$ is the pressure (Pa) at the leakage point; $A_e = CA_0$ is the effective leakage area (m$^2$); C is the orifice coefficient, which is related to the shape of the leakage hole; $A_0$ is the area of the leakage hole (m$^2$); $P_d$ is the initial pressure (Pa) of the pipeline; k is the adiabatic coefficient of the gas, dimensionless; R is the gas constant, J·kg$^{-1}$·K$^{-1}$; and T is the temperature (K) of the gas; D is the inner diameter (m) of the pipeline; $\lambda$ is the friction resistance coefficient; and A is the cross sectional area (m$^2$) of the pipeline.

S4: Define an objective function:

S4.1: show the difference between the calculated pressure and the real pressure of the node according to the leakage control equations (17-21), for example:

$$\text{Min}E = \left| \frac{\frac{\lambda a^2 \Delta x(M_1^2 + M_2^2)}{4DA^2}}{P_A - P_B + \frac{a}{A}(M_A + M_B) - \frac{a}{A}(M_1 + M_2) - \frac{\lambda a^2 \Delta x}{4DA^2}\left(\frac{M_A^2}{P_A} + \frac{M_B^2}{P_E}\right)} - P_{real} \right| \quad (22)$$

S4.2: Determine the effective range of the leakage area, so as to determine the upper limit of the leakage amount. Herein, the effective leakage area when the radius of the leakage hole is 5 mm is taken as the maximum limit of the leakage area.

$$0 \leq A_e \leq 7.85 \times 10^{-5} m^2 \quad (23)$$

S4.3: Determine the friction resistance coefficient in the pipeline.

According to the different flow states of the gas in the PE pipe, different calculation formulas are used for the friction resistance coefficients $\lambda$ of different pipe materials. A PE pipe calculation formula used in this article is the Blasius formula.

Blasius formula:

$$\lambda = \frac{0.3164}{\text{Re}^{0.25}} \quad (24)$$

wherein the Reynolds coefficient calculation formula adopts an empirical formula:

$$\text{Re} = 0.354 \times \frac{Q_v}{Dv} \quad (25)$$

$$v = \frac{\mu}{\rho} \quad (26)$$

where $\lambda$ is the friction resistance coefficient; Re is the Reynolds coefficient; $Q_v$ is the volume flow rate (m³/s); D is the inner diameter (m) of the pipeline; $v$ is the kinematic viscosity (m²/s); $\mu$ is the dynamic viscosity (Pa·s); and $\rho$ is the gas density (kg/m³). At 24 degrees Celsius, the dynamic viscosity of air is $1.83 \times 10^{-5}$ Pa·s, and the kinematic viscosity is $1.4364 \times 10^{-5}$ m²/s. By substituting the steady-state data and parameters under non-leakage into equations (24-26), it is calculated that the friction resistance coefficient in the pipeline is approximately 0.01.

S5: Algorithm optimization.

S5.1: Substitute the pressure and flow rate data of the node X2 in the 14th to 15th sets in the experimental data, the pressure and flow rate data at 1.6 m in front of and behind X2, and known parameters into equation (22) to obtain an objective function:

$$\text{Min}E = \left| \frac{3805873057.73(M_1^2 + M_1^2)}{781.91 - 208295.35(M_1 + M_2)} - P_{real} \right| \quad (27)$$

S5.2: Define a nonlinear constraint $$M_1 - M_2 \geq 0 \quad (28)$$

$$0 \leq M_1 \leq M_{B+\Delta t} + M_{Lmax} \quad (29)$$

$$M_{B+\Delta t} \leq M_2 \leq M_{A+\Delta t} \quad (30)$$

$M_{Lmax}$ is the maximum leakage amount, which is 0.0258 kg/s, calculated by substituting the leakage area of the maximum limit into the leakage amount formula (3), and the followings are obtained:

$$\text{s.t.} \begin{pmatrix} -1 & 1 \\ 0 & 0 \end{pmatrix} \begin{pmatrix} M_1 \\ M_2 \end{pmatrix} \leq \begin{pmatrix} 0 \\ 0 \end{pmatrix} \quad (31)$$

$$\begin{pmatrix} 0 \\ 0.00089 \end{pmatrix} \leq \begin{pmatrix} M_1 \\ M_2 \end{pmatrix} \leq \begin{pmatrix} 0.0293 \\ 0.00089 \end{pmatrix} \quad (32)$$

S5.3: Determine an initial value $X_0 = [0.00343, 0.00089]$

S5.4: VLB=[0, 0.00089], and VUB=[0.0293, 0.00089]

S5.5: Obtain a result, $M_1 = 0.0029$, and $M_2 = 0.0009$, that is, the calculated difference in flow rate between the front and back ends of node $X_2$ is 0.002 kg/s, and it is calculated that the leakage area is $6.09 \times 10^{-7}$ m². According to steps S5.1 to S5.5, the differences in flow rate in front of and behind the $X_1$, $X_3$, and $X_4$ nodes are correspondingly calculated as 0 kg/s, 0 kg/s, and 0 kg/s respectively, and the leakage areas are calculated as 0 m², 0 m², and 0 m² respectively.

S6: Leakage location:

S6.1: After calculation, the difference in flow rate in front of and behind nodes $X_1$, $X_3$, and $X_4$ is 0, and the leakage area is 0, and therefore, none of the three nodes is leaking; obvious difference in flow rate between the front and rear ends of node $X_2$ proves that leakage occurs at node $X_2$ in a certain position of the pipe section from 1.6 m long front section to 1.6 m long rear section, while the calculation result of node $X_3$ is normal, so it is determined that there is no leakage at node $X_3$ on the pipe section from 1.6 m long front section to 1.6 m long rear section. Therefore, on the pipe section 1.6 m in front of node $X_2$ to node $X_2$, the node is set again for calculation.

S6.2: Division of nodes $X_5$ and $X_6$ is continued, see FIG. 2, and the leakage areas are respectively calculated to $6.09 \times 10^{-7}$ m² and 0 m² according to the differences in flow rate in front of and behind nodes $X_5$ and $X_6$, which are 0.002 kg/s and 0 kg/s respectively, are calculated correspondingly when $\Delta x$ is 0.4 m according to steps S5.1 to S5.4. It is proved that there is leakage in the pipe section at 0.4 m in front of and behind $X_5$, and the node can be set up again according the needs to continue the calculation. In this experiment, node $X_5$ is a leakage point, and it can be proved that the leaking pipe section can be found by calculating the pressure and flow rate of the monitoring node in this method. The shortcomings are that this method relies too much on the selection of nodes, and the establishment of the model, the calculation of parameters, etc. all have influence on the accuracy of the results.

Embodiment 2

This embodiment is different from Embodiment 1 in that the method for determining pipeline leakage in step S1 is different. In this embodiment, a Markov chain-based method is adopted to realize non-metallic pipeline leakage determination.

S1: Determine whether leakage occurs in the pipeline. The non-metallic pipeline leakage determination based on Markov chain includes the following steps:

Step B1: collect a first set of five flow rates by using a flow sensor installed on the pipeline: 2.78, 2.79, 2.82, 3.07, and 3.7, in units of m³/h, and calculating a first set of five flow change rates, $q_i = \Delta Q_i/Q_i \times 100\%$, according to the formula $q_1 = 0\%$, $q_2 = 3.58\%$, $q_3 = 1.06\%$, $q_4 = 8.14\%$, $q_5 = 17.02\%$.

step B2: set four change states: a first state: the value of the flow change rate $q_i$ is 0, indicating that the pipeline is in a non-leakage state; a second state: the value of the flow change rate $q_i$ is 0-1(%), indicating that the pipeline is in a small leakage state; a third state: the value of the flow change rate $q_i$ is 1-3(%), indicating that the pipeline is in a leakage expanded state; and a fourth state: the value of the flow change rate $q_i$ is 3-100(%), indicating that the pipeline is in a large leakage state;

setting conditions: the leakage of the pipeline is a sudden change process, the change of the leakage state is a gradual process; due to the influence of various other factors, the working state of the pipeline may be directly changed from an operation state to a certain degree of leakage in the leakage state due to the influence of various other factors, and the leakage state of the pipeline is irreversible, but the degree of leakage is reversible; according to the above-mentioned conditions, an adjacency matrix A of pipeline leakage is obtained as follows:

$$A = \begin{bmatrix} A_{11} & \cdots & A_{1j} \\ \vdots & \ddots & \vdots \\ A_{i1} & \cdots & A_{ij} \end{bmatrix} = \begin{bmatrix} 1 & 1 & 1 & 1 \\ 0 & 1 & 1 & 1 \\ 0 & 1 & 1 & 1 \\ 0 & 1 & 1 & 1 \end{bmatrix}$$

where $A_{ij} = 1 = 1, 2 \ldots 4$; $j = 1, 2 \ldots 4$) indicates that there is a transition relationship between the i-th state and the j-th state, and $A_{ij} = 0$ indicates that there is no transition relationship between the i-th state and the j-th state.

State classification is performed on the first set of flow change rates obtained in step 1 to classify the flow change rates into these four states. In order of time, these are counted in the five periods of time in chronological order. Each element in the state transition probability matrix P is formed according to the state transition situation of the flow change rates.

The calculation process of the state transition probability matrix P is as follows:

step B2.1: according to the classification, deriving that the number of flow rate changes in the first state is 1, the number of transitions from the first state to the first state is 0, the number of transitions from the first state to the second state is 0, the number of transitions from the first state to the third state is 0, and the number of transitions from the fourth state to the second state is 0, and collecting statistics about the state transition situation of these five flow change rates at the next moment:

the transition probability from the first state to the first state is $p_{11}=0$;

the transition probability from the first state to the second state is $p_{12}=0$;

the transition probability from the first state to the third state is $p_{13}=1$; and the transition probability from the first state to the fourth state is $p_{14}=0$;

step B2.2: deriving that the number of flow rate changes in the second state is 0, the number of transitions from the second state to the second state is 0, the number of transitions from the second state to the third state is 0, and the number of transitions from the second state to the fourth state is 0, and collecting statistics about the state transition situation of the zero flow change rate at the next moment:

the transition probability from the second state to the first state is $p_{21}=0$;

the transition probability from the second state to the second state is $p_{22}=0$;

the transition probability from the second state to the third state is $p_{23}=0$; and the transition probability from the second state to the fourth state is $p_{24}=0$;

step B2.3: deriving that the number of flow rate changes in the third state is 1, the number of transitions from the third state to the second state is 0, the number of transitions from the third state to the third state is 0, and the number of transitions from the third state to the fourth state is 1, and collecting statistics about the state transition situation of the zero flow change rate at the next moment:

the transition probability from the third state to the first state is $p_{31}=0$;

the transition probability from the third state to the second state is $p_{32}=0$;

the transition probability from the third state to the third state is $p_{33}=0$; and the transition probability from the third state to the fourth state is $p_{34}=1$;

step B2.4: deriving that the number of flow rate changes in the fourth state is 3, the number of transitions from the fourth state to the second state is 0, the number of transitions from the fourth state to the third state is 0, and the number of transitions from the fourth state to the fourth state is 2, and collecting statistics about the state transition situation of the zero flow change rate at the next moment:

the transition probability from the fourth state to the first state is $p_{41}=0$;

the transition probability from the fourth state to the second state is $p_{42}=0$;

the transition probability from the fourth state to the third state is $p_{43}=1/3$; and the transition probability from the fourth state to the fourth state is $p_{44}=2/3$;

then the state transition probability matrix P in the Markov chain is:

$$P = \begin{bmatrix} 0 & 0 & 1 & 0 \\ 0 & 0 & 0 & 0 \\ 0 & 0 & 0 & 1 \\ 0 & 0 & 1/3 & 2/3 \end{bmatrix}$$

Step B3: collect a second set of flow rates: 4.79, 6.62, 7.16, 7.66, and 8.22, in units of m3/h. A second set of five flow change rates are obtained: $q_1=22.75$, $q_2=27.64$, $q_3=7.54\%$, $q_4=6.52\%$, $q_5=6.81\%$; like step 2, the number of these five flow change rates in each interval is counted, and the actual flow change rate in each interval at this time is edited as the first parameter vector and is set as $\alpha_1=[0\ 0\ 0\ 5]$, wherein $\alpha_1$ represents the first parameter vector; 0 represents the number of flow change rates in the first state among the five flow rate change rates under the first parameter vector; 0 represents the number of flow change rates in the second state among the five flow rate change rates under the first parameter vector; 0 represents the number of flow change rates in the third state among the five flow rate change rates under the first parameter vector; and 5 represents the number of flow change rates in the fourth state among the five flow rate change rates under the first parameter vector;

the parameter vector $\beta_1$ of the predicted flow change rate based on the Markov chain in the future time period is obtained through Markov chain calculation, and the formula thereof is:

$\beta_1=\alpha_1\times P$, the obtained $\beta_1=[0\ 0\ 0\ 5]$.

It can be derived from $\beta_1=[0\ 0\ 0\ 5]$ that, at this time, it is predicted that the number of parameters in the fourth state at the next moment is the largest, containing five parameters, wherein S=4, then at this time, it is predicted that the state at the next moment is the fourth state, i.e., the large leakage state.

Step B4: collect a third set of flow rates: 8.66, 8.66, 9.01, 9.22, and 9.42, in units of m³/h, and obtain a third set of flow change rate values $q_1=5.08\%$, $q_2=0\%$, $q_3=3.88\%$, $q_4=2.33\%$, $q_5=2.12\%$. Like steps, the number of matches in each interval is counted and is set as $\alpha_2=[1\ 021]$, wherein it is derived that the number of parameters in the third state at this time is the largest, containing two parameters, i.e., $N_{W_{max}}=3$, where W=2, that is, the actual state is the third state at this time.

Step B5: Compare the number values of S in $N_{S_{max}}$ and Win $N_{W_{max}}$.

Because S=4, W=2, S>W, it is derived that the pipeline is in the late stage of the beginning of leakage, and it is determined that the state is the third state.

Step B6: set the second set of data as the first set of data and the third set of data as the second set, of data, and continue to predict and determine the real-time state or leakage situation of the pipeline. In this case, the pipeline is in the third state of leakage, it is determined that leakage occurs, an alarm program is triggered, and the system starts to given an alarm.

The calculation of leakage location in this example, i.e., steps S2 to S6, is the same as that in Embodiment 1. It is not necessary to repeat the description.

Summary: both methods for pipeline leakage determination based on software simulation and Markov method have their advantages and disadvantages, the software simulation method can only summarize the law of smooth distribution of leaking and non-leaking states, the advantage is that the analysis of the flow field distribution laws in two states can provide theoretical ideas for the determination of leakage and give a theoretical basis; however, in specific practice, it is difficult to quantify the specific value to determine whether tiny leakage occurs in the pipeline; moreover, the Markov method can determine the leakage situation of the pipeline according to the capture of flow rate parameters, but it may cause misjudgments due to the influence of other factors on the flow rate, and requires a lot of data to ensure the accuracy of the leakage determination.

Taking the above-mentioned ideal embodiment according to the present invention as enlightenment, through the above-mentioned description content, relevant workers can make various changes and modifications without departing from the scope of the present invention. The technical scope of the present invention is not limited to the content on the description, and its technical scope must be determined according to the scope of the claims.

What is claimed is:

1. An urban non-metallic pipeline leakage location method, comprising the following steps:
   step S1: determining whether leakage occurs in a pipeline, which is determining whether the leakage occurs in the pipeline through characteristic law analysis based on numerical simulation of pipeline leakage or a Markov chain-based flow analysis method;
   step S2: conducting pipeline leakage experiment and obtaining pipeline pressure and flow rate data, which is producing transient pipe flow by gradually closing a valve, and maintaining a valve closing time long enough to minimize influence of instability and uncertainty of a friction coefficient, so as to obtain pressure and flow rate data of each of a plurality of measuring point in different periods of time;
   step S3: establishing a pipeline leakage control equation, which is establishing the pipeline leakage control equation of a non-metallic pipeline gas leakage state by using a nonlinear equation solved based on continuity and motion equations of a gas and a leakage amount equation of a leakage hole, substituting pressures $P_A$ and $P_B$ and flow rates $M_A$ and $M_B$ at both $\Delta x$-distance ends of a monitoring point measured in step S2 into the control equation to obtain equations for calculating pressure $P_L$ and flow rates $M_1$ and $M_2$ of the monitoring point, on this basis, comparing the calculated pressure $P_L$ of the monitoring point at a certain time point with real data of test according to a principle of inverse-transient calculation, and converging a difference between the two to a minimum value by using a Sequence Quadratic Programing (SQP) algorithm so as to obtain leakage parameters that conform to an actual situation;
   step S4: defining an objective function, which is performing inverse problem analysis on the obtained leakage parameters by taking a minimum value of a difference between a calculated value and a measured value of a pressure at the monitoring point as a control target and taking the control equation and boundary conditions as limiting conditions, to define the objective function with a least squares objective criterion, wherein pressures $P_A$ and $P_B$ and flow rates $M_A$ and $M_B$ of measuring points A and B at the both ends of the monitoring point $\alpha$ at a certain time point are given by the experiment, the calculated pressures $P_1$ and $P_2$ and flow rates $M_1$ and $M_2$ at the both ends of the monitoring point $\alpha$ are unknown after a unit time step $\Delta t$, and based on a difference in flow rate, whether a leakage occurs in the monitoring point $\alpha$ is determined; substituting data according to the leakage control equation in S3 and expressing an equation of the flow rates $M_1$ and $M_2$ on the pressure $P_L$ at the both ends of the monitoring point $\alpha$, obtaining flow rate data of the monitoring point conforming to a real situation by converging a difference between the calculated pressure $P_L$ and a real pressure to the minimum, and substituting the flow rate data of the monitoring point into a gas leakage amount equation to obtain an effective leakage area, so as to determine a leakage situation of the monitoring point;
   step S5: performing algorithm optimization, which is setting flow constraint ranges at the both ends of the monitoring point in step S4 by using an SQP method, and minimizing the objective function according to the pressure and flow rate data obtained in step S3 to determine the leakage parameters of the effective leakage area; and
   step S6: leakage location positioning, which comprises the following step:
   S6.1: if a leakage area of a node is found to be non-zero at an end of a minimization in S5, regarding the node as a leaking node; and
   S6.2: if the leakage point is not at the monitoring point, that is, neither of the leakage areas of two adjacent monitoring points is zero, then considering that the leakage point is between two adjacent monitoring points of which neither of the leakage areas is zero, and equidistantly arranging a plurality of measuring nodes between the two adjacent monitoring points; substituting measured data and calculated data of a node of the plurality of measuring nodes as the monitoring point into the objective function; and repeating S5 and the equidistantly arranging and the substituting steps of S6.2 for a next plurality of measuring nodes between two previously arranged adjacent nodes until a distance between two adjacent nodes is less than 4% of a pipeline detection length, or until a leakage area of a node is found to be non-zero at an end of a minimization in S5.

2. The urban non-metallic pipeline leakage location method according to claim 1, wherein,
   method for determining an occurrence of leakage of the pipeline through characteristic law analysis based on numerical simulation of pipeline leakage in step S1 comprises: modeling the pipeline by using a modeling software, simulating pressure and flow rate parameter distributions, of the gas in non-metallic pipeline leakage and non-leakage states by using a fluid simulation software, and verifying same through experiments to respectively find, out laws of pressure and flow rate parameters of the gas changing with time and space in the non-metallic pipeline leakage and non-leakage states, so as to give standards for determining whether leakage occurs in the pipeline, wherein the method for determining an occurrence of leakage of the pipeline through characteristic law analysis based on numerical simulation of pipeline leakage in step S1 specifically comprises the following steps:
   step A1: modeling an experimental pipeline, using a structured tetrahedral mesh for region division, and performing proper mesh refinement near a leakage port;
   step A2: control equation and algorithm selection:
   choosing a standard k–ε double equation model as a numerical model; in the model, using turbulent energy k to reflect a characteristic velocity, using a turbulent energy dissipation rate ε to reflect a characteristic length scale, using Boussinesq hypothesis for simplification to form k equation and ε equation, and combining the two equations together to form a closed equation set to simulate a flow, specifically:

$$k \text{ equation } \frac{\partial(\rho k)}{\partial t} + \frac{\partial(\rho k u_i)}{\partial x_i} = \frac{\partial}{\partial x_j}\left[\left(\mu + \frac{\mu_t}{\sigma_k}\right)\frac{\partial k}{\partial x_j}\right] + G_k + G_b - \rho\varepsilon - Y_M + S_K \quad (1)$$

$$\varepsilon \text{ equation } \frac{\partial(\rho\varepsilon)}{\partial t} + \frac{\partial(\rho k u_i)}{\partial x_i} = \frac{\partial}{\partial x_i}\left[\left(\mu + \frac{\mu_t}{\sigma_t}\right)\frac{\partial\varepsilon}{\partial x_j}\right] + \frac{C_{1\varepsilon}\varepsilon}{k}(G_k + C_{3\varepsilon}G_b) - C_{2\varepsilon}\rho\frac{\varepsilon^2}{k} + S_\varepsilon \quad (2)$$

where $x_i$ and $x_j$ are coordinate components; $u_i$ a velocity vector; $\rho$ is a fluid density; $\mu$ is a viscosity coefficient; $\mu_t$ is a turbulent viscosity; t represents time; $G_k$ and $G_b$ are production terms of velocity gradient and turbulent kinetic energy k caused by buoyancy; constants $C_{1\varepsilon}$=1.44, $C_{2\varepsilon}$=1.92, $C_{3\varepsilon}$=0.09, $\sigma_k$=1.0, and $\sigma_t$=1.3, $S_k$ and $S_\varepsilon$ are user-defined source items; and $Y_M$ is a pulsating expansion term in compressible turbulent flow;

choosing SIMPLE algorithm as a numerical calculation algorithm of the model; for a given pressure, solving a momentum, equation in a discrete form to obtain a velocity field, and then correcting the given pressure and iterating repeatedly until a convergent solution is obtained;

step A3: boundary condition settings, comprising condition settings for an inlet and an outlet, and physical parameter settings fora fluid and a pipe material; and step A4: simulating changes in internal pressure and flow rate parameters of the pipeline in the pipeline leakage and non-leakage states respectively under given multiple sets of inlet pressures to find out change laws of pressure and flow rate parameters, so as to give the standards for determining whether leakage occurs in the pipeline, and then comparing an actual measured pipeline data with the standards to determine leaking pipelines and non-leaking pipelines;

step A4.1: analyzing numerically simulated flow fields of internal pressure and flow rate of the pipeline in the leakage and non-leakage states to find out the change laws of the internal pressure and flow rate of the entire pipeline before and after the leakage;

step A4.2: analyzing the flow fields of pressure and flow rate of the experimental pipeline in the leakage and non-leakage states to find out change laws of the internal pressure and flow rate of the entire pipeline before and after the leakage; and step A4.3: comparatively analyzing the change laws of the internal pressure and flow rate of the pipeline before and after the leakage obtained through the numerical simulation and the experiments, and summarizing the change laws to obtain specific standards for determining an occurrence of leakage of the pipeline.

3. The urban non-metallic pipeline, leakage location method according to claim 1, wherein, determining the occurrence of leakage of the pipeline through a Markov chain-based flow analysis method in step S1 specifically comprises: dividing an operation state of a non-metallic pipeline into a normal operation state and a leakage state, wherein a process of the pipeline changing from the normal operation state to the leakage state is a sudden change process, and the process is irreversible; on this basis, obtaining a matrix of transition probability of pipeline change in real time, and predicting a development trend of pipeline flow rate change; and determining the occurrence of leakage of the pipeline by comparing predicted pipeline flow rate change with an actual pipeline flow rate change.

4. The urban non-metallic pipeline leakage location method according to claim 1, wherein, the pipeline leakage control equation established in step S3 comprises the nonlinear equation solved based on continuity and motion equations of the gas and the leakage amount equation of the leakage hole, specifically as follows:

the continuity and motion equations of the gas:

$$\frac{\partial M}{\partial t} + \frac{1}{A}\frac{\partial}{\partial x}\left(\frac{M^2}{\rho}\right) + A\frac{\partial p}{\partial x} + \frac{\lambda}{2DA\rho}M|M| = 0 \quad (8)$$

$$A\frac{\partial \rho}{\partial t} + \frac{\partial M}{\partial x} = 0 \quad (9)$$

where M is a flow velocity of the gas, whose dimensional unit is $kg \cdot S^{-1}$; A is a cross sectional area of the pipeline, whose dimensional unit is $m^2$; P is a pressure, whose dimensional unit is Pa; $\rho$ is a gas density, whose dimensional unit is $kg \cdot m^{-3}$; D is an inner diameter of the pipeline, whose dimensional unit is m; and $\lambda$ is a friction resistance coefficient;

equations (8) and (9) are solved by using a characteristic line method to obtain two sets of characteristic line equations, which are expressed by C+ and C−, specifically as follows:

$$C+: \frac{1}{a}\frac{dp}{dt} + \frac{1}{A}\frac{dM}{dt} + \frac{\lambda a^2 M|M|}{2DA^2 P} = 0 \quad (10)$$

$$\frac{dx}{dt} = a \quad (11)$$

$$C-: -\frac{1}{a}\frac{dp}{dt} + \frac{1}{A}\frac{dM}{dt} + \frac{\lambda a^2 M|M|}{2DA^2 P} = 0 \quad (12)$$

$$\frac{dx}{dt} = -a \quad (13)$$

where $\alpha$ is a velocity of pressure wave, whose dimensional unit is m/s; and when the gas in the pipeline is flowing isothermally, $\alpha$ is a constant value;

formulas (11) and (13) are C+ and C− characteristic lines AP and BP, respectively;

formulas (10) and (12) are compatibility equations satisfying respective characteristic lines; the pipeline is equally divided into N equal parts, with a step length being $\Delta x$ and a time step length being $\Delta t = \alpha \Delta x$; t represents time and x represents length; formulas (10) and (12) are integrated along C+ characteristic line AP and C− characteristic line BP, respectively; second-order approximation is used for a third term of a compatibility equation, namely a friction term, to obtain two nonlinear equations on the C+ characteristic line and the C− characteristic line, specifically as follows:

$$P_P - P_A + \frac{a}{A}(M_P - M_A) + \frac{\lambda a^2 \Delta x}{4DA^2}\left(\frac{M_A|M_A|}{P_A} + \frac{M_P|M_P|}{P_P}\right) = 0 \quad (14)$$

$$P_B - P_P + \frac{a}{A}(M_P - M_B) + \frac{\lambda a^2 \Delta x}{4DA^2}\left(\frac{M_B|M_B|}{P_B} + \frac{M_P|M_P|}{P_P}\right) = 0 \quad (15)$$

where $M_P$ is a flow rate at the monitoring point requiring a calculation of the leakage parameters, and $P_P$ is a pressure at the monitoring point requiring a calculation of the leakage parameters;

if the pipeline leakage is regarded as small hole leakage, a gas leakage formula depends on the flow velocity of the gas at the leakage port, and the flow velocity of the gas at the leakage port is generally subsonic, specifically as follows:

$$M_L = A_e P_d \sqrt{\frac{k}{RT}\left(\frac{2}{k+1}\right)^{\frac{k+1}{k-1}}} \quad (16)$$

where $M_L$ is a leakage flow rate of the leakage hole, whose dimensional unit is kg·s⁻¹; $A_e = CA_0$ is an effective leakage area, whose dimensional unit is m²; C is an orifice coefficient, which is related to the shape of the leakage hole; $A_0$ is an area of the leakage hole, whose dimensional unit is m²; $P_d$ is an initial pressure of the pipeline, whose dimensional unit is Pa; k is an adiabatic coefficient of the gas, dimensionless; R is a gas constant, whose dimensional unit is J·kg⁻¹; and T is a temperature of the gas, whose dimensional unit is K;

assuming that the monitoring node is a leakage point, the pipeline leakage control equation is established to analyze the pressure and flow rate data of the monitoring node; taking the leakage hole as a boundary, flow characteristics within the Δx distance before flowing into the leakage hole satisfy formula (14), and the flow characteristics within the Δx distance after flowing out of the leakage hole satisfy formula (15); supposing that a subscript of the fluid parameter before flowing through the leakage hole is 1, and a subscript of the fluid parameter after flowing through the leakage hole is 2, then the established pipeline leakage control equation is specifically as follows:

$$P_1 - P_A + \frac{a}{A}(M_1 - M_A) + \frac{\lambda a^2 \Delta x}{4DA^2}\left(\frac{M_A|M_A|}{P_A} + \frac{M_1|M_1|}{P_1}\right) = 0 \quad (17)$$

$$P_B - P_2 + \frac{a}{A}(M_2 - M_B) + \frac{\lambda a^2 \Delta x}{4DA^2}\left(\frac{M_B|M_B|}{P_B} + \frac{M_2|M_2|}{P_2}\right) = 0 \quad (18)$$

$$M_L = A_e P_d \sqrt{\frac{k}{RT}\left(\frac{2}{k+1}\right)^{\frac{k+1}{k-1}}} \quad (19)$$

$$M_1 - M_2 = M_L \quad (20)$$

$$P_1 = P_2 = P_L \quad (21)$$

where $P_1$ is a fluid pressure, whose dimensional unit is Pa, at the Δx distance before flowing into the leakage point, $M_1$ is a flow rate, whose dimensional unit is kg·s⁻¹, at the Δx distance before flowing into the leakage point; $P_2$ is a fluid pressure, whose dimensional unit is Pa, at the Δx distance after flowing out of the leakage point, and $M_2$ is a flow rate, whose dimensional unit is kg·s⁻¹, at the Δx distance after flowing out of the leakage point; and $P_L$ is a pressure at the leakage point, whose dimensional unit is Pa.

5. The urban non-metallic pipeline leakage location method according to claim 1, wherein, taking a minimum value of the difference between the calculated value and the measured value of the pressure at the monitoring point as the control target to define the objective function in step S4 is specifically as follows:

S4.1: defining an objective function with a least squares criterion:

$$E = \min \sqrt{\sum_{i=1}^{M}(P_i - P'_i)^2} \quad (22)$$

where E is an objective function; M is a number of time steps; $P_i$ is a calculated pressure, Pa; $P'_i$ is a measured pressure, Pa; and the effective leakage area that best conforms to the actual situation is generated by minimizing the objective function E, and whether a node is leaking is determined according to a value of the effective area;

S4.2: determining a limit range of the effective leakage area:

$$0 \leq A_{ei} \leq A_{emax} \quad (23)$$

where $A_{ei}$, is an effective leakage area at node i; and $A_{emax}$ is a maximum limit of the leakage area, which is determined as a reasonable proportion of a cross sectional area of the pipeline;

S4.3: calculating a friction resistance coefficient by a friction resistance calculation formula according to an experimental data, wherein a flow of the gas in the pipeline is generally in a;turbulent region, specifically:

Blasius formula $$\lambda = \frac{0.3164}{Re^{0.25}} \quad (24)$$

wherein Reynolds coefficient calculation formula adopts an empirical formula:

$$Re = 0.354 \times \frac{Q_v}{Dv} \quad (25)$$

$$v = \frac{\mu}{\rho} \quad (26)$$

where λ is a friction resistance coefficient; Re is Reynolds coefficient; $Q_v$ is a volume flow rate, whose dimensional unit is m³·s⁻¹; D is an inner diameter of the pipeline, whose dimensional unit is m; v is a kinematic viscosity, whose dimensional unit is m²·s⁻¹;

μ is a dynamic viscosity, whose dimensional unit is Pa·s; and ρ is a gas density, whose dimensional unit is kg·m⁻³.

6. The urban non-metallic pipeline leakage location method according to claim 1, wherein, the SQP algorithm is used in step S5 to converge the objective function E within the flow constraint ranges at the both ends of the monitoring point set in S4, and performing the algorithm optimization comprises specifically as follows:

S5.1: establishing a file and defining an objective function E(x) according to experimental data;

S5.2: establishing a file and defining a nonlinear constraint in a constraint condition;
S5.3: determining an initial value $X_0$ of iteration;
S5.4: determining upper and lower limits VLB and VUB of variable; and
S5.5: establishing a main program comprising a function of a nonlinear programming solution, and running the solution.

* * * * *